United States Patent [19]

Noel et al.

[11] Patent Number: 4,912,355
[45] Date of Patent: Mar. 27, 1990

[54] SUPERLATTICE STRAIN GAGE

[75] Inventors: Bruce W. Noel, Espanola; Darryl L. Smith; Dipen N. Sinha, both of Los Alamos, all of N. Mex.

[73] Assignee: The United States of America as represented by the United States Department of Energy, Washington, D.C.

[21] Appl. No.: 212,854

[22] Filed: Jun. 28, 1988

[51] Int. Cl.$^4$ .................................... H01L 41/08
[52] U.S. Cl. .................................. 310/311; 310/338; 310/339; 310/357; 310/332; 73/774; 73/775; 73/800
[58] Field of Search ............... 310/311, 330, 331, 332, 310/357-359; 73/760, 762, 763, 774, 775, 776, 777, 778, 800

[56] References Cited

U.S. PATENT DOCUMENTS

| | | | |
|---|---|---|---|
| 1,694,661 | 12/1928 | Meissner | 310/311 X |
| 2,816,236 | 12/1957 | Rosen | 310/311 X |
| 2,966,673 | 12/1960 | Guernsey, Jr. | 310/311 X |
| 3,087,148 | 4/1963 | Ludewig, Jr. | 310/311 X |
| 3,183,359 | 5/1965 | White | 310/311 X |
| 3,560,955 | 2/1971 | Hallman | 310/311 X |
| 3,600,611 | 8/1971 | Treharne | 310/311 X |
| 3,614,201 | 10/1971 | Biazzo | 310/311 X |
| 3,647,665 | 3/1972 | Lester | 310/311 X |
| 3,710,283 | 1/1973 | Alphonse | 310/311 X |
| 3,924,444 | 12/1975 | Heyman et al. | 310/311 X |
| 4,106,933 | 8/1978 | Taylor | 310/311 X |
| 4,427,913 | 1/1984 | Iafrate et al. | 310/311 X |
| 4,539,501 | 9/1985 | Trong et al. | 310/311 X |
| 4,590,399 | 5/1986 | Roxlo et al. | 310/334 |
| 4,711,857 | 12/1987 | Cheng | 437/357 |

OTHER PUBLICATIONS

Bruce W. Noel et al., "A Superlattice Strain Gage," Los Alamos National Laboratory report LA-UR-8-7-1713, submitted to AIAA/SAE/ASME/ASEE 23rd Joint Propulsion Conference, Jun. 29-Jul. 2, 1987, San Diego, Calif.
L. Vina et al., "AlGaAs/GaAs (111) Heterostructures Grown by Molecular Beam Epitaxy," Appl. Phys. Lett., 48 (1), pp. 36-37, (Jan. 6, 1986).
W. I. Wang et al., "Crystal Orientation Dependence of Silicon Doping in Molecular Beam Epitaxial AlGaAs/GaAs Heterostructures," Appl. Phys. Lett 47 (8), pp. 826-828, (Oct. 15, 1985).
D. L. Smith et al., "Strained Type II Superlattices," Los Alamos National Laboratory report La-UR-8-7-961, presented to Electronic Properties of Two-Dimensional Systems-VII, Jul. 27-31, 1987, Santa Fe, N.M. and published in Surface Science 196, p. 683, (Mar. 1988).
Darryl L. Smith et al., "Piezoelectric Effects in Strained-Layer Superlattices," Los Alamos National Laboratory report LA-UR-87-3089, and published in the J. App. Phys. 63, p. 2717, (Apr. 15, 1988).
Bernhard K. Laurich et al., "Optical Properties of GaInAs/GaAs and GaInAs/GaAlAs Strained Layer Superlattices Grown in the [111] Direction," Los Alamos National Laboratory report LA-UR-88-647 submitted to the 19th International Conference on the Physics of Semiconductors, Warsaw, Poland, (Aug. 15-19, 1988).
C. Mailhiot et al., "Effect of Internal Piezoelectric Fields on the Electronic structure and Optical Properties of Strain-Layer Superlattices," Los Alamos National Laboratory report LA-UR-88-951 to be published in a chapter of the book entitled Strained Layer

(List continued on next page.)

*Primary Examiner*—Mark O. Budd
*Attorney, Agent, or Firm*—Milton D. Wyrick; Paul D. Gaetjens; William R. Moser

[57] ABSTRACT

A strain gage comprising a strained-layer superlattice crystal exhibiting piezoelectric properties is described. A substrate upon which such a strained-layer superlattice crystal has been deposited is attached to an element to be monitored for strain. A light source is focused on the superlattice crystal and the light reflected from, passed through, or emitted from the crystal is gathered and compared with previously obtained optical property data to determine the strain in the element.

14 Claims, 9 Drawing Sheets

OTHER PUBLICATIONS

Superlattices, edited by Robert Biefeld, Sandia National Laboratory.

B. K. Laurich et al., "Study of the Optical Properties of [100] and [111] Oriented GaInAs/GaAs Strained Layer Superlattices," Los Alamos National Laboratory report LA-UR-88-1232, and a shortened version of item 11, next.

Bernhard Laurich et al., "Optical Properties of (100) and (111) Oriented GaInAs-GaAs Strained Layer Superlattices," submitted to Physical Review Letters but not yet published.

Bernhard K. Laurich et al., "Optical Properties of GaInAs/GaAs and GaInAs/GaAlAs Strained Layer Superlattices Grown in the [111] Direction," Los Alamos National Laboratory report LA-UR-88-2102. This paper is to be presented at the 19th International Conference on the Physics of Semiconductors, Warsaw, Poland, (Aug. 15-19, 1988).

D. L. Smith, "Strain Generated Electric Fields in [111] Growth Axis Strained Layer Superlattices," Solid State Commun. 57, No. 12, (Mar. 1986).

C. Mailhiot et al., "Effects of Strain-Induced Electric Fields on the Electronic Structure of [111] Growth Axis Semiconductor Superlattices," J. Vac. Sci. Technol. B4 (4), pp. 996-999, (Jul./Aug. 1986).

D. L. Smith et al., "K . P Theory of Semiconductor Superlattice Electronic Structure I: Formal Results," Phys. Rev. B-33, No. 12, p. 8345, (Jun. 15, 1986).

C. Mailhiot et al., "K . P Theory of Semiconductor Superlattice Electronic Structure II: Application to $Ga_{1-x}In_xAs-Al_{1-y}In_yAs$ [100] Superlattices," Phys. Rev. B-33, No. 12, p. 8360, (Jun. 15, 1986).

C. Mailhiot et al., "Piezo-Modulation of the Electronic Structure and Optical Properties of [111] Growth-Axis Strained-Layer Superlattices," Solid State Commun. 66, No. 8, p. 859, (1988).

SUPERLATTICE STRAIN GAGE

BACKGROUND OF THE INVENTION

The invention relates to strain gages and, more specifically, to optical strain gages comprised of strained-layer superlattice crystals. This invention is the result of a contract with the Department of Energy (Contract No. W-7405-ENG-36).

Conventional resistance-type strain gages use the change in electrical resistance of a sensor to measure strain. Although considerable effort has been expended to develop resistance-type strain gages for use in hostile environments, such gages suffer from numerous disadvantages. Chief among these disadvantages are limited accuracy, large errors caused by significant temperature dependence, unsatisfactory resolution, frequency response, dynamic range and temperature range. In addition, resistance-type gages require electrical leads and other perturbing appurtenances. These problems may limit application of resistance-type strain gages in areas of high temperature or high vibration. However, it is often the case that it is in these types of environments that the most accurate strain measurements are required.

The present invention presents a new type strain gage comprising a strained-layer superlattice crystal, and will hereinafter often be referred to as superlattice strain gage or SSG. Superlattices are layered structures (heterostructures) comprising alternating layers of two or more materials either in ordered crystal or amorphous forms. Strained-layer superlattices are fabricated from crystalline materials having significantly different lattice constants. In the usual nonsuperlattice heterostructure device, the layers are grown to be relatively thick. Superlattices, on the other hand, have layer thicknesses of atomic dimensions. In one embodiment of a superlattice crystal, the total heterostructure-device thickness is typically in the range of 1–10 $\mu$, and the individual layer thicknesses are typically in the range of 20–200 Å.

It is well known that crystals exhibiting the piezoelectric effect, that is, the generation of a voltage under mechanical stress or its converse, a mechanical strain under electrical stress, produce an electrical dipole moment proportional to an applied mechanical stress. This phenomenon has been extensively applied to the area of transducers such as microphones, phonograph pickups, and vibration sensing instruments.

The foundation of the present invention is that the optical properties (i.e., reflection, absorption, refractive index etc.) of certain piezoelectric strained-layer superlattices vary strongly with applied external strain, thereby allowing measurement of strain through measurement of any of these optical properties. This variance of optical properties in strained-layer superlattices is also due to a piezoelectric effect in the superlattice crystal.

It is therefore one object of the present invention to provide a strain gage capable of producing high-accuracy, high-resolution measurements over wide dynamic ranges.

Another object of the invention is to provide a strain gage having a wide frequency response and little temperature dependence affecting its accuracy or resolution.

One advantage of the present invention is that no electrical leads are attached to the strain gage.

Another advantage of the invention is that a strain gage in accordance herewith is passive.

Yet another advantage of the invention is that a strain gage in accordance herewith can accurately function in remote, difficult, or hostile environments, as long as optical access is available.

Still another advantage of the present invention is that it can be used to measure two-dimensional strain fields, with resolution limited only by the available optical resolution, and not by the gage itself.

Additional objects, advantages, and novel features of the invention will be set forth in part in the description which follows, add in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, a strain gage may comprise a substrate operably attachable to an element to be monitored for strain, with the substrate having deposited on it a strained-layer superlattice crystal exhibiting piezoelectric properties and optical properties that change in response to strain on the element.

In a further aspect of the present invention, and in accordance with its objects and purposes, apparatus for monitoring strain on an element may comprise a substrate operably attachable to the element with the substrate having deposited on it a strained-layer superlattice crystal exhibiting piezoelectric properties and optical properties that change in response to strain on the element. Monitoring means monitor changes in the optical properties and calculating means calculate the strain on the element from the changes in the optical properties.

In a still further aspect of the present invention, and in accordance with its objects and purposes, a method for measuring strain on an element may comprise operably attaching a substrate to the element, the substrate having deposited on it a strained-layer superlattice crystal exhibiting piezoelectric properties and optical properties that change in response to strain on the element. The change in the optical properties is monitored and the strain on the element is calculated from the change in the optical properties.

BRIEF DESCRIPTION OF THE DRAWINGS

The accompanying drawings, which are incorporated in and form a part of the specification, illustrate at least one embodiment of the present invention and, together with the description, serve to explain the principles of the invention. In the drawings:

FIGS. 5a and 5b are plots of the calculated absorption spectrum (absorption coefficient versus photon energy) for a superlattice crystal according to the present invention subject to no strain, and to an external strain of $5 \times 10^{-3}$ inches/in.

DETAILED DESCRIPTION OF THE INVENTION

One embodiment of the present invention utilizes a strained-layer superlattice structure to indicate external strain through changes in its optical properties. A strained-layer superlattice structure is layered crystal heterostructure consisting of two or more layers of material, where alternating layers have significantly different lattice constants, mismatched by 1-2%, and each layer is of atomic dimensions in thickness.

Figure 1:
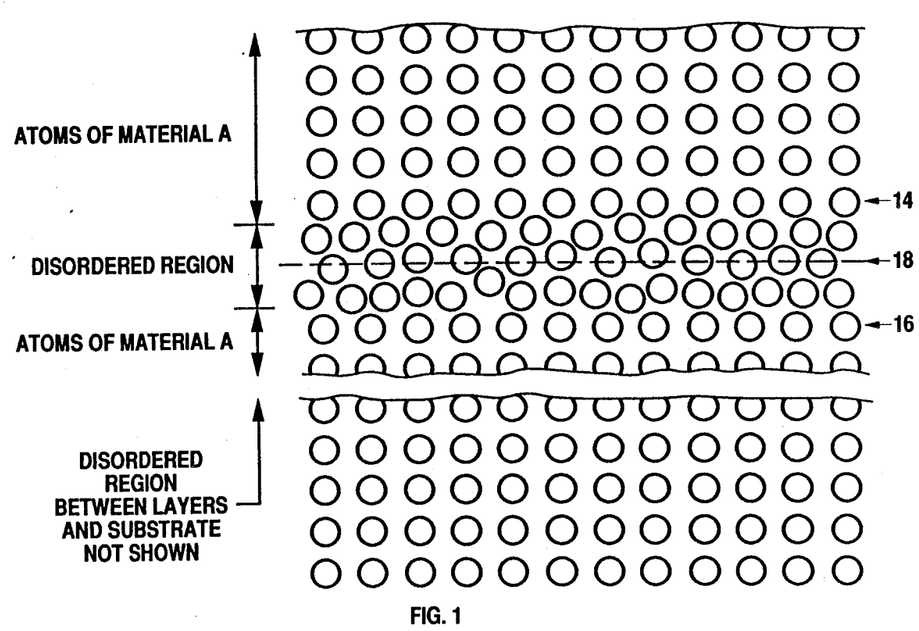
FIG. 1 is a simplified schematic cross section view of a typical heterostructure crystal deposited on a substrate.

Referring now to FIG. 1, there can be seen a simplified submicroscopic schematic cross-sectional view of a typical nonsuperlattice heterostructure crystal 12 having relatively thick layers 14, 16 deposited on substrate 10. With relatively thick layers 14, 16, lattice mismatch, that is, the different atomic spacings in the different materials, results in dislocations, including vacancies and interstices, to appear at interface 18 between layers 14, 16. During crystal growth, these dislocations arrange themselves in an attempt to minimize the total internal energy of the crystal.

Figure 2:
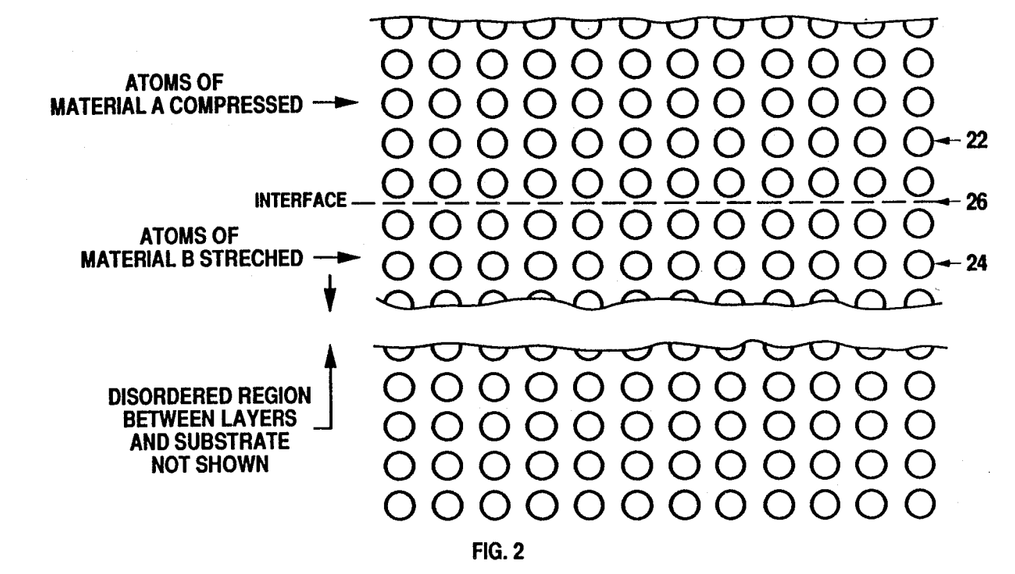
FIG. 2 is a simplified schematic cross section view of a strained-superlattice structure deposited on a substrate in accordance with the present invention.

However, in the case of superlattice heterostructures, as shown in FIG. 2, layers 22, 24 are grown to be very thin, on the order of atomic dimensions. With superlattices, the atomic dislocations common to thick layer structures do not occur at interface 26. Instead, as illustrated in FIG. 2 by compression of atoms in layer 22 and expansion of atoms in layer 24, the lattice constants of the materials adjust so as to be equal. This adjustment minimizes the internal energy of layers 22, 24 by substituting internal strains for the dislocations.

Layers 22, 24 may have thicknesses on the order of 20-200 Å each, and the total thickness of the entire structure may be approximately 1-10 $\mu$. For certain crystal growth orientations, stretching and compression in alternate superlattice layers cause opposing electric fields to exist in the alternating layers due to the piezoelectric effect. In particular, semiconductor crystals of the zincblende structure (two interpenetrated face-centered cubic structures) grown in other than the [100] direction generate such fields. Crystals grown in the [111] direction produce the largest perpendicularly polarized electric fields which, in a layered structure, tend to cancel each other in adjoining layers. It has been shown that the net external field is only on the order of 1000 V/cm. However, the internal electric field in each layer can be much stronger, exceeding 100,000 V/cm for lattice constant mismatches of the order of 1%.

These internal fields strongly modify the electronic structure and optical properties of the superlattice. They accomplish this through alteration of the electronic energy levels and wavefunctions, which, in turn, modify the optical transition energies and oscillator strengths.

Figure 3:
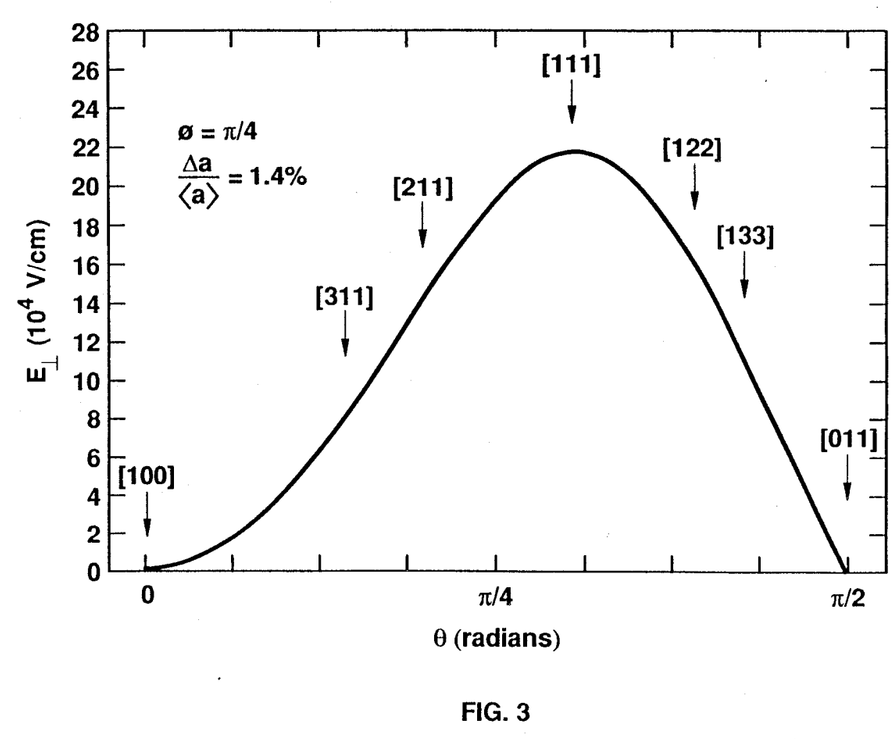
FIG. 3 is a graph of the perpendicular electrical field component versus crystal growth angle for a superlattice strain gage in accordance with the present invention.

Referring now to FIG. 3, which was calculated by a procedure discussed below, it can be seen that the maximum perpendicular polarization field for a GaInAs superlattice crystal occurs for the [111] growth direction. However, this is a broad maximum, and growth directions of [211] and [122] also produce strong fields.

The optical properties of materials are nonlinear and proportional to the optical matrix elements, with the first term in the power-series-expansion description of typical optical properties varying with the square of the internal electric field. This means that a sufficiently large internal or built-in field will have a significant effect on the optical properties of a material. For a normal range of strains, the modifications of the electronic structure caused by the external strain induced fields are very small if there is no built-in electric field. However, the large built-in fields of superlattice heterostructures with the proper growth orientation act as a bias, causing any external strain to raise the level of the fields to the point where significant modification of the electronic structure occurs because the external strain corresponds to modulations of a quadratic effect about the large bias point. In the case of superlattice structures as described herein, any external strain will add vectorially to the internal strain of the crystal, thus adding vectorially to the internal perpendicular electric field, and changing the optical properties of the various layers relative to each other. Measurement of this change in optical properties is equivalent to measurement of that external strain.

In order to use such optical properties in strain measurement, it is first necessary to calculate the expected magnitudes of the optical effects. The procedure by which this is accomplished involves first calculating the elements of the stress versus strain tensor. Using the calculated strain, the electric field caused thereby is calculated using standard elastic continuum theory. With knowledge of the strain and change in the electric field, the change in the electronic properties of the superlattice crystal, such as the energy gap, can be determined using quantum mechanics. The change in the energy bandgap is then set equal to the material's built-in inhomogeneity broadening, providing an approximation of the minimum measurement uncertainty. This procedure is discussed in more detail in a technical paper involving one of the inventors herein (D. L. Smith and C. Mailhiot, Phys, Rev. B. 33, 8345 and 8360 (1986)). The optical matrix elements are obtained from the resulting polarization vectors and the superlattice eigenstates as described in another technical paper involving one of the inventors herein (D. L. Smith and C. Mailhiot, Phys. Rev. Letters 58, 1264 (1987)). The text of these technical papers is included herein for all purposes as if they were fully copied and set forth in this application.

Figure 4:
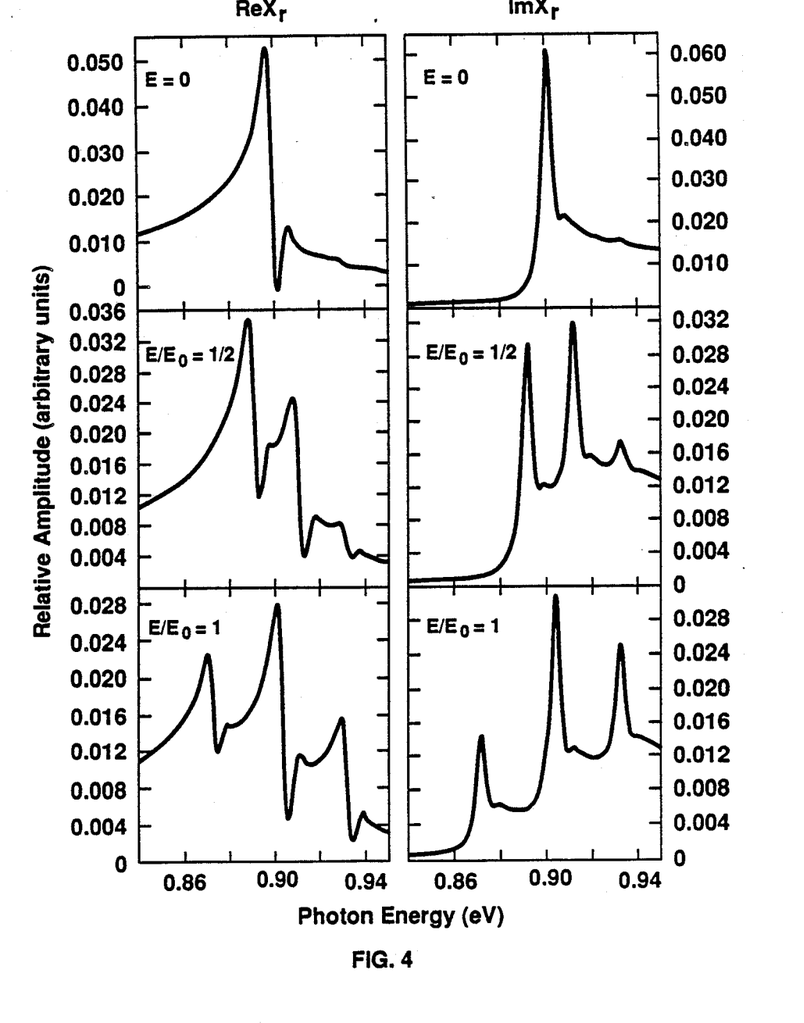
FIG. 4 is a series of plots of the real and imaginary parts of the complex electric susceptibility as functions of photon energy with relative values of the built-in electric field as a parameter.

FIG. 4 is a plot of the real and imaginary parts of the electric susceptibility of a superlattice crystal as functions of photon energy, as calculated by the above procedure. The complex electric susceptibility is related to the crystal's refractive index and extinction coefficient, hence to the complex index of refraction, he reflection coefficient, and the transmission coefficient. It is clear from FIG. 4 how strongly the optical properties of a superlattice crystal are affected by the intensity of the electric field, which field can be changed by external stress, as described herein.

In one embodiment of the present invention, a SSG is constructed by growing layers of $Ga_{0.47}In_{0.53}As$, approximately 25 atoms or 80 Å thick, alternating with layers of $Al_{0.70}In_{0.30}As$, approximately 50 atoms or 160 Å thick on an InP substrate by molecular beam epitaxy techniques, well known in the art. The lattice mismatch is 1.5%, causing the $Ga_{0.47}In_{0.53}As$ layers to be in biaxial compression with no external stress applied. This crystal, grown along the [111] axis, exhibits a strong strain induced piezoelectric field of approximately 141 kV/cm.

Figure 5A:
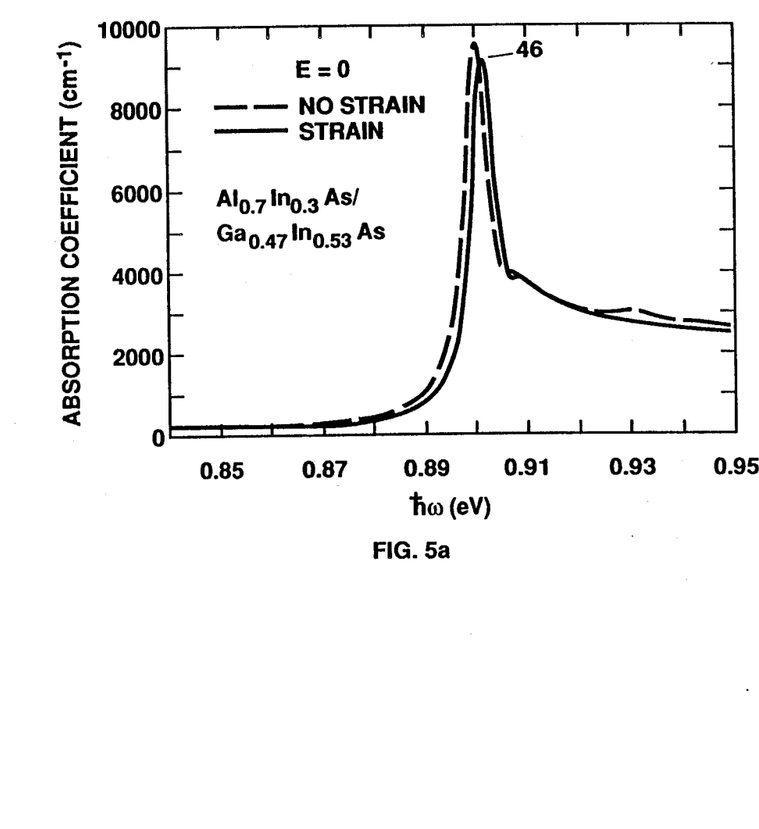
Figure 5B:
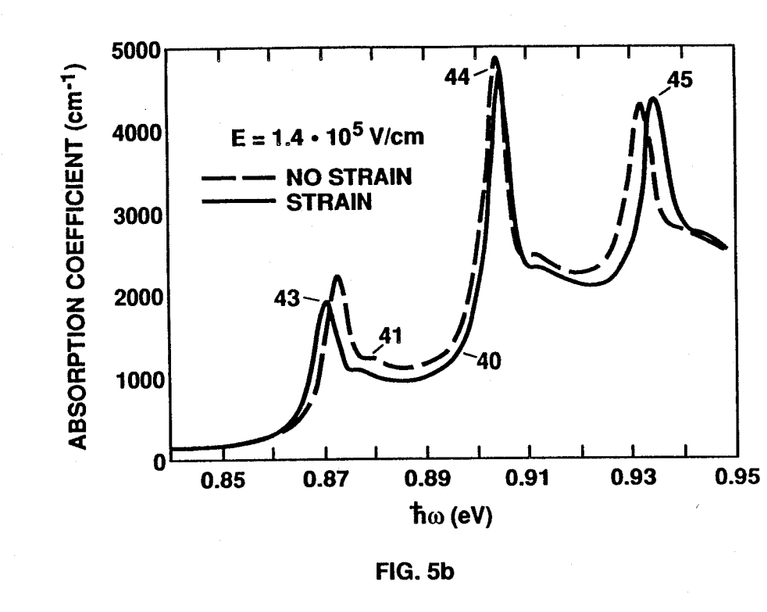

As external stress is applied to this superlattice crystal, the compressive strain on, and the internal electric fields in the $Ga_{0.47}In_{0.53}As$ layers increase at a rate of approximately 3 kV/cm for each $10^{-3}$ in. of external strain. FIG. 5 at (b) is a plot of the calculated absorption spectrum (absorption coefficient versus photon energy) for a built-in electric field of 140 kV/cm resulting from an external compressive strain that causes a strain modulation of $5 \times 10^{-3}$ inches/in. solid line 40). and for zero external strain (dotted line 41). The large change in the absorption coefficient is easily detectable at wavelengths near peak 43 at approximately 0.87 eV and near peak 45 at approximately 0.93 eV. This is in contrast to FIG. 5 at (a). where the single peak 46 occurs near 0.91 eV for no field and a strain of $5 \times 10^{-3}$ inches/in.

Use of the absorption spectrum was chosen because experimentally obtaining the absorption spectrum is a fundamental and widely used technique, and is the most direct, and perhaps the simplest, method for probing the band structure of semiconductors. Also, the absorption coefficient is mathematically related to other optical properties such as the real component of the index of refraction (through the Kramers-Kronig relations) the imaginary component of the index of refraction (the extinction coefficient), the reflection coefficient (and hence the reflectivity spectrum), the polarizability or electric susceptibility, and the transmission coefficient. Further, other optical properties, such as the photoluminescence, are also related to the material's absorption.

To date, most studies of strained-layer superlattices have been performed on III-V semiconductor systems, although some have been performed on II-VI semiconductor systems and on group IV materials. However, there is no a priori reason mandating that strained-layer superlattices be made from such systems. They represent only the systems most studied to the present time.

It has been shown that, for strained-layer superlattices made from zincblende-structure semiconductors with [111] growth direction, large internal electric fields are generated by the piezoelectric effect. However, these fields are not present in a zincblende structure grown in the [100] direction. Of the 32 crystal classes, 20 exhibit the piezoelectric effect. Crystals of an of these classes, or combinations of classes, that exhibit piezoelectricity and large changes in optical properties due to strain induced electric fields may serve as superlattice strain gages. However, each such crystal or combination will have to be examined individually to verify that it permits operation as a SSG. At the present time, none of these has been sufficiently studied, so that it is not certain which of such piezoelectric crystals can be employed as superlattice strain gages.

This uncertainty should not be taken as limiting the scope of this invention to the currently recognized structures. The SSG of the present invention is intended to encompass any presently known or later discovered strained-layer superlattices that exhibit strain induced polarization fields.

When a superlattice structure, such as illustrated in FIG. 2, is attached to an element subject to stress, the resulting strain in the element can be detected and measured. In one embodiment this is accomplished by illuminating the superlattice structure with a light beam, and observing the beam after it has passed through, or been reflected from the superlattice structure, or by observing the photoluminescence of the superlattice structure caused by the beam. Index of refraction, reflectivity, birefringence, and photoluminescence are among the optical properties of the superlattice structure that may be used to give an indication that is proportional to the strain in the element. This configuration will render point-by-point strain information, if the light beam scans the surface of the superlattice, to yield two-dimensional strain resolution.

Figure 6:
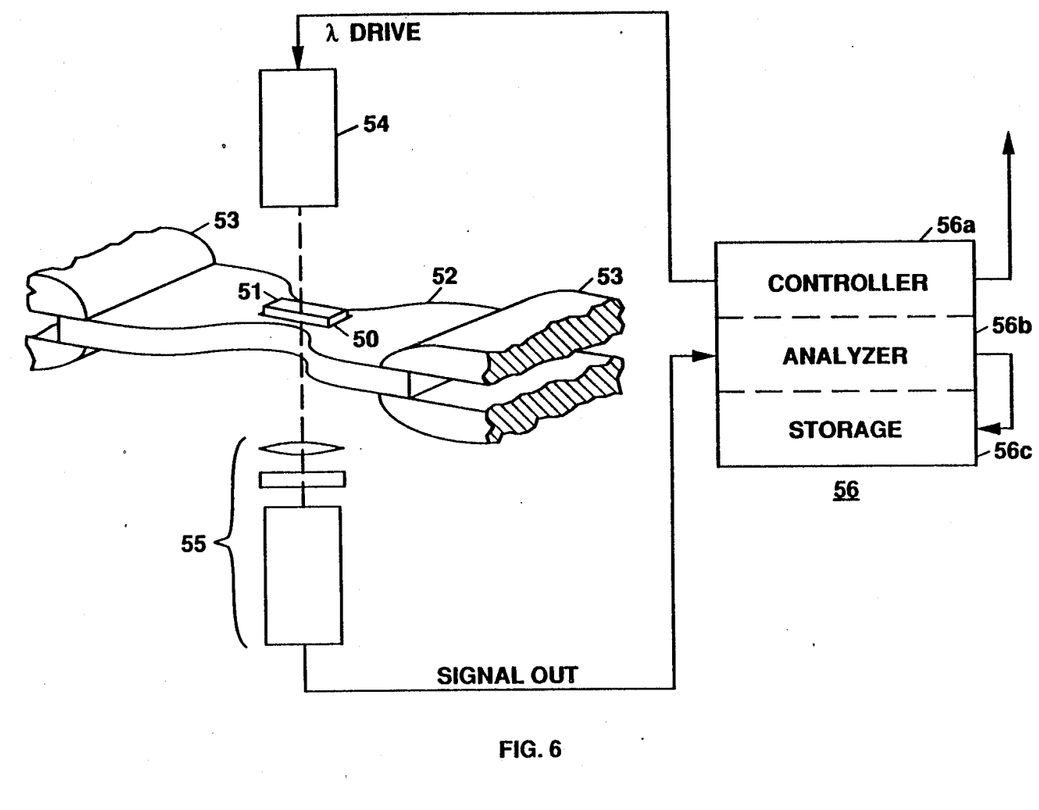
FIG. 6 is a schematic representation of one possible equipment set-up that could be used to calibrate a superlattice strain gage according to the present invention, using photoluminescence from the SSG for calibration.

The operation of one embodiment of the invention can be best understood by reference to FIG. 6, where substrate 50 containing strained-layer superlattice 51 enlarged disproportionately to show detail) is shown attached to transparent element 52 using conventional strain gage adhesives. Light from laser 54, which could be a Nd:Yag:dye laser, is focused on a surface of superlattice 51, and light being passed through superlattice 51 and element 52 is gathered by optical detector 55 through its associated lenses and filters.

The wavelength of laser 54 is determined by controller 56a of computer 56, which also controls the tension applied to element 52 through clamps 53 of a conventional tensile test machine (not shown). In general, the wavelength range of laser 54 must cover the energy peaks of superlattice 51. The signal emitted by optical detector 55 is connected to analyzer 56b of computer 56, where a plot of tensile stress (and hence, strain) versus the optical property of interest is calculated and stored in storage 56c. Although use of laser 54 is simpler, an infrared lamp could be used a long as a monochromator is employed in series wit it for wavelength tuning. Also, if deemed necessary, laser 54 could be scanned over the surface of superlattice 51 to resolve two-dimensional strains.

This equipment configuration can be readily used to determine experimentally the information to be stored, either by computer or manually, for comparison with optical property changes experienced in a field application. In this example, absorption spectra could be used in strain measurement. Obtaining such spectra can be accomplished using well-known laboratory techniques. In a simple procedure, the external tensile and compressive stress on superlattice 51 are varied while the absorption coefficient is measured and plotted as a calibration curve. Of course, most field applications will not involve elements to be measured which are optically transparent. In this case, it will be necessary to obtain calibration data for one or more of the many other optical properties of superlattice 51 which are affected by external strain, such as photoluminescence.

It is most convenient to store calibration values in a computer, although there is no reason that comparisons cannot be performed manually. After the data is stored, superlattice 51 is ready for application in the field. It should be noted that it is not necessary to obtain precise calibration values for any of the optical properties of interest. It is only necessary to record the change in the optical parameter experienced for a given change in external stress.

Figure 7:
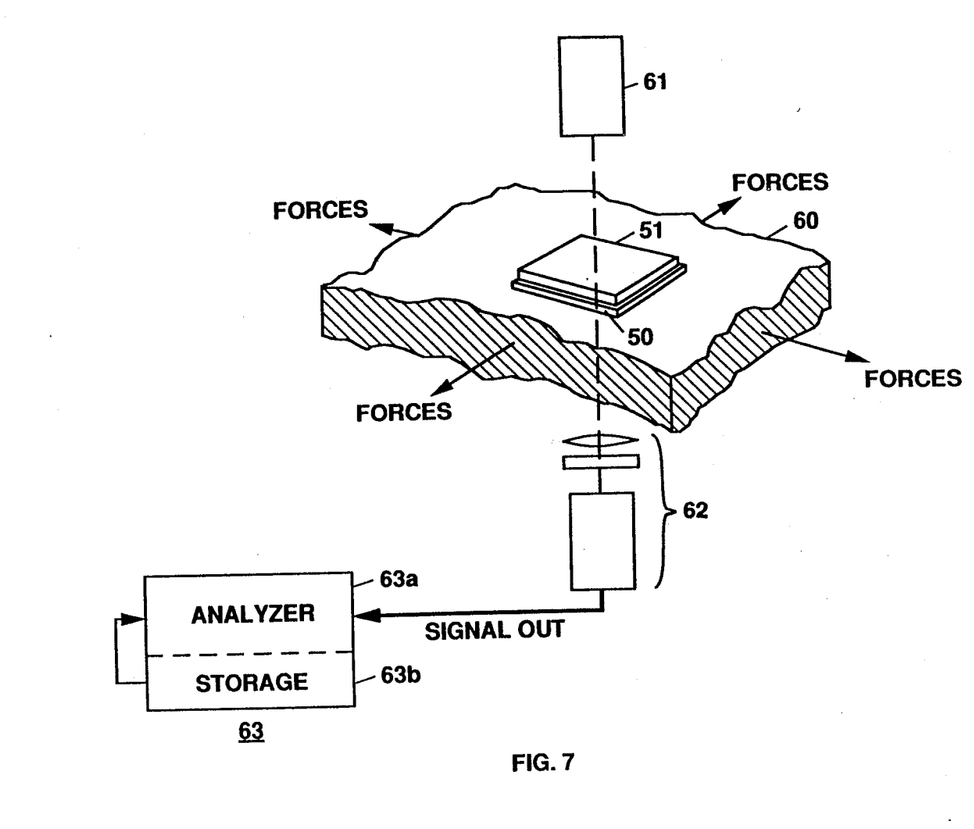
FIG. 7 is a schematic representation of an equipment arrangement for field application of a SSG according to the present invention utilizing a single light source.

One possible field configuration is illustrated in FIG. 7, where substrate 50 containing strained-layer superlattice 51 is shown attached to element 60 which is monitored for strain. Laser 61 is tuned to a wavelength near an absorption peak of superlattice 51, and focused on its surface. In this case, element 60 is transparent to light from laser 61 so that light passing through superlattice 51 can be collected by optical detector 62 through its associated optics. The signal out of optical detector 62 is connected to analyzer 63a of computer 63 where it is compared with the data stored in storage 63b of computer 63.

Figure 8:
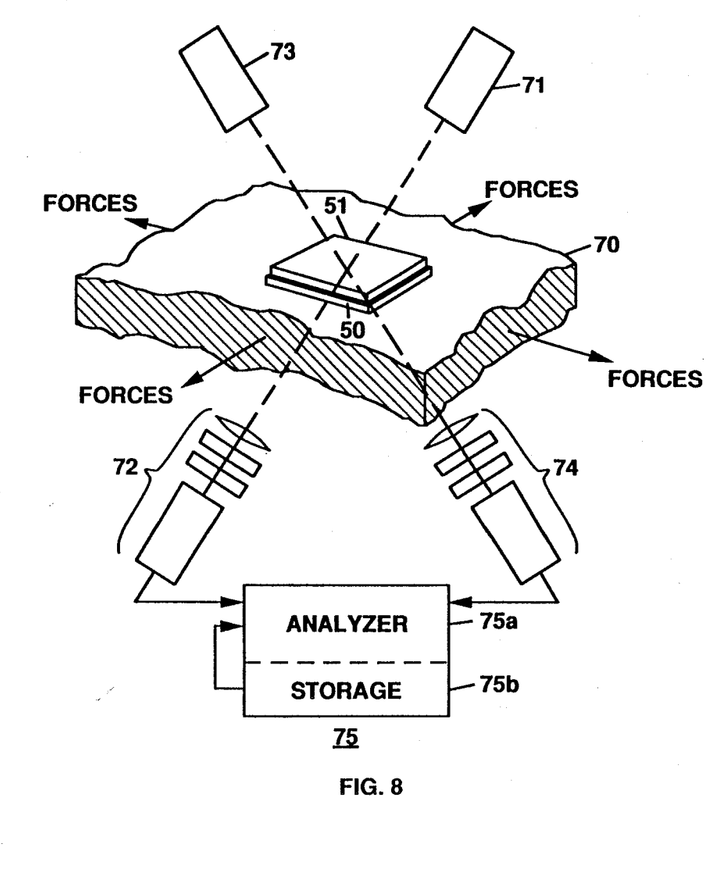
FIG. 8 is a schematic representation of an equipment arrangement for field application of a SSG according to the present invention utilizing two light sources.

One other possible field configuration is illustrated in FIG. 8, where superlattice 51 is interrogated by two combinations of lasers and optical detectors. In this case, laser 71 is tuned to an absorption peak of superlattice 51 and light passing through superlattice 51 is collected by optical detector 72 and its associated optics. The second laser 73 is tuned to a second absorption peak of superlattice 51 and light passing through superlattice 51 is collected by optical detector 74 and its associated optics. The signals from optical detectors 72, 74 are connected to analyzer 75a of computer 75, where they are compared to data stored in storage 75b of computer 75, which data was obtained from a calibration configuration as shown in FIG. 5, but with two lasers tuned as described for lasers 71, 73. The use of dual lasers 71, 73 enhances resolution and improves the sensitivity of the apparatus.

Although no data have been obtained for the temperature dependence of the optical parameters of superlattice 51, a strong qualitative argument can be made that such effects are quite small This opinion is based on the fact that all of the optical interrogation methods that are likely to be employed to measure strain measure a change in the optical parameters. Even if the optical property has an unknown value because of a large uncertainty in the temperature, the differential change will vary only slightly because it depends almost entirely on the change in the electric-field strength, and not on its absolute value.

The foregoing description of the preferred embodiments of the invention has been presented for purposes of illustration and description. It is not intended to be exhaustive or to limit the invention to the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. Apparatus for monitoring strain on an element comprising:
   a substrate operably attachable to said element;
   a strained-layer superlattice crystal deposited on said substrate for exhibiting piezoelectric properties and optical properties that change in response to said strain on said element;
   means for monitoring said change in said optical properties of said superlattice crystal; and
   means for calculating said strain on said element from said change in said optical properties.

2. The apparatus as described in claim 1, wherein said superlattice crystal has a zincblende structure.

3. The apparatus as described in claim 1, wherein said superlattice crystal is grown in a direction.

4. The apparatus as described in claim 2, wherein said superlattice crystal comprises a plurality of alternating layers of a gallium alloy and an aluminum alloy.

5. The apparatus as described in claim 4, wherein said monitoring means comprises one or more lasers and one or more optical detectors.

6. The apparatus as described in claim 4, wherein said optical properties comprise absorption coefficient, index of refraction, reflectivity, birefringence, and photoluminescence.

7. The apparatus as described in claim 4, wherein said calculating means comprises a computer.

8. The apparatus as described in claim 4, wherein said gallium alloy comprises $Ga_{0.47}In_{0.53}As$.

9. The apparatus as described in claim 4, wherein said aluminum alloy comprises $Al_{0.70}In_{0.30}As$.

10. A method of measuring strain on an element comprising:
    operably attaching a substrate to said element, said substrate having deposited on it a strained-layer superlattice crystal for exhibiting piezoelectric properties and optical properties that change in response to said strain on said element;
    monitoring said change in said optical properties of said superlattice crystal; and
    calculating said strain on said element from said change in said optical properties.

11. The method as described in claim 10, wherein said monitoring step comprises a light source focused on a surface of said superlattice crystal.

12. The method as described in claim 11, wherein said light source comprises one or more lasers.

13. The method as described in claim 11, wherein said calculating step further comprises the steps of gathering light from said superlattice crystal and comparing said light with stored optical measurements to determine said strain on said element.

14. The method as described in claim 10, wherein said strained-layer superlattice crystal comprises a plurality of layers comprised of $Ga_{0.47}In_{0.53}As$ alternating with a plurality of layers comprised of $Al_{0.70}In_{0.30}As$.

* * * * *